(12) United States Patent
Myers et al.

(10) Patent No.: US 6,560,110 B1
(45) Date of Patent: May 6, 2003

(54) CORROSIVE RESISTANT FLIP CHIP THERMAL MANAGEMENT STRUCTURE

(75) Inventors: Bruce A. Myers, Kokomo, IN (US); Thomas A. Degenkolb, Noblesville, IN (US); Henry M. Sanftleben, Carmel, IN (US); Darrel E. Peugh, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/079,760

(22) Filed: Feb. 22, 2002

(51) Int. Cl.[7] .................................................. H05K 7/20
(52) U.S. Cl. ..................... 361/705; 361/704; 361/707; 257/687; 257/796; 174/52.2
(58) Field of Search ................................ 361/704–710, 361/713, 719, 720, 752; 174/16.3, 52.2, 173; 165/80.3, 125; 257/706, 687, 707, 796

(56) References Cited

U.S. PATENT DOCUMENTS

| | | | | | |
|---|---|---|---|---|---|
| 4,849,803 | A | * | 7/1989 | Yamamoto et al. | 257/687 |
| 5,625,536 | A | * | 4/1997 | Soyano et al. | 361/736 |
| 6,087,682 | A | * | 7/2000 | Ando | 257/178 |
| 6,144,557 | A | * | 11/2000 | Chen et al. | 361/704 |
| 6,144,571 | A | * | 11/2000 | Sasaki et al. | 363/144 |
| 6,147,869 | A | * | 11/2000 | Furnival | 361/719 |
| 6,272,015 | B1 | * | 8/2001 | Mangtani | 361/707 |
| 6,285,551 | B1 | * | 9/2001 | Brandenburg et al. | 361/704 |
| 6,419,784 | B1 | * | 7/2002 | Ferrier | 156/314 |

* cited by examiner

Primary Examiner—Boris Chervinsky
(74) Attorney, Agent, or Firm—Jimmy L. Funke

(57) ABSTRACT

A corrosive resistant electronics assembly 10 is provided including at least one heat generating electronics component 12 mounted on a substrate 14 and positioned within potting material 18. A thermally conductive block element 24 is thermally mounted to the at least one heat generating electronics component 12 and positioned within the potting material 18, thereby providing a corrosive resistant electronics assembly 10 with improved thermal dissipation.

26 Claims, 1 Drawing Sheet

CORROSIVE RESISTANT FLIP CHIP THERMAL MANAGEMENT STRUCTURE

TECHNICAL FIELD

The present invention relates generally to a corrosive resistant electronics assembly and more particularly to a corrosive resistant flip chip thermal management structure utilizing a heat sink capable of being used in potted and plastic cased modules.

BACKGROUND OF THE INVENTION

The design of electronics assemblies must often incorporate a variety of constraints. One of such constraints is the ability to dissipate heat from chips located on the electronics assembly. Chips, such as flip chips, are often mounted on a wide variety of substrates (including ceramic, PCB, flex, etc.). Commonly these chips generate thermal energy that must be dissipated in order for the chips, and the underlying electronic assembly, to function properly and prevent damage. It is known that such heat dissipation may be managed in a variety of methods.

One known method of dissipating heat from a flip chip is accomplished by providing a thermal path from the chip into a ceramic board substrate or into copper traces on a PCB. This is normally accomplished using solder interconnects between the flip chips and the circuitboard and/or by using flip chip underfill. Flip chip underfill provides a thermally conductive path between the flip chip and the board for heat transfer. Using this method, the circuit board is used to dissipate thermal energy into the air inside the case or, if the circuitboard is rigidly mounted to a metal case, the energy may be dissipated through the length of the circuitboard into the metal case. Although this method has been widely used, it is known that heat dissipation using this method is often limited. Therefore, this method, as commonly practiced, may not provide adequate heat dissipation for many applications.

Another known method utilizes a similar technique to that previously described. A thermal path is still used to transfer heat from the flip chip into the circuitboard, however, a module metal case is designed to touch the bottom of the circuitboard and thereby energy passes through the thickness of the board into the module metal case. Thins method of heat dissipation often offers improvements in dissipating power over the previously described method.

A third method of disippating thermal energy from the flip chips involves providing a low thermal resistance contact between the top of the nip chip and a module metal case. This is commonly accomplished through the use of a pedestal located above the flip chip. This method avid similar methods dissipating heat directly from the flip chip into the module metal case can provide further increases in the dissipation of thermal energy.

Although each of the aforementioned methods of heat dissipation have proven useful in a variety of applications, each carries with it disadvantages that leave significant room for improvement. One area where these methods can prove ineffective arises in applications subjected to severe and corrosive environments. Severe and corrosive environments, such as salt spray/salt water immersion environments, may damage metal module cases and therefore make them unsuitable. The use of plastic cases and/or potted controllers to seal the electronics from the corrosive environment can prevent the use of thermal dissipation techniques which previously utilized a metal case as a heat sink. The poor thermal conductivity of plastic and potting material prevents their use as a primary heat sink. Simple dissipation of heat into the circuit board allows for a greater range of casing materials, however its limited thermal dissipation capacity makes this solution unsuitable for many applications. Consequently, an electronics assembly that provided improved heat dissipation characteristics while allowing for use in potted controller situations and/or plastic cases would be highly desirable.

SUMMARY OF THE INVENTION

It is therefore an object of tile present invention to provide an electronics assembly with improved thermal dissipation characteristics that may be used in conjunction with potted controllers and/or plastic cases such that it may be used in applications subjected to highly corrosive environments.

In accordance with the object of the present invention, an electronics assembly is provided. The electronics assembly includes at least one chip mounted on a substrate. The chip and substrate are positioned within pottable material to create a corrosive resistant assembly. The electronics assembly further includes a thermally conductive block element positioned within the pottable material and thermally mounted to the chip. Thermal energy generated by the chip is thereby allowed to dissipate from the chip into the thermally conductive block element.

Other objects and features of the present invention will become apparent when viewed in light of the detailed description of the preferred embodiment when taken in conjunction with the attached drawing and the appended claims.

DESCRIPTION OF THE PREFERRED EMBODIMENT(S)

Figure 1:
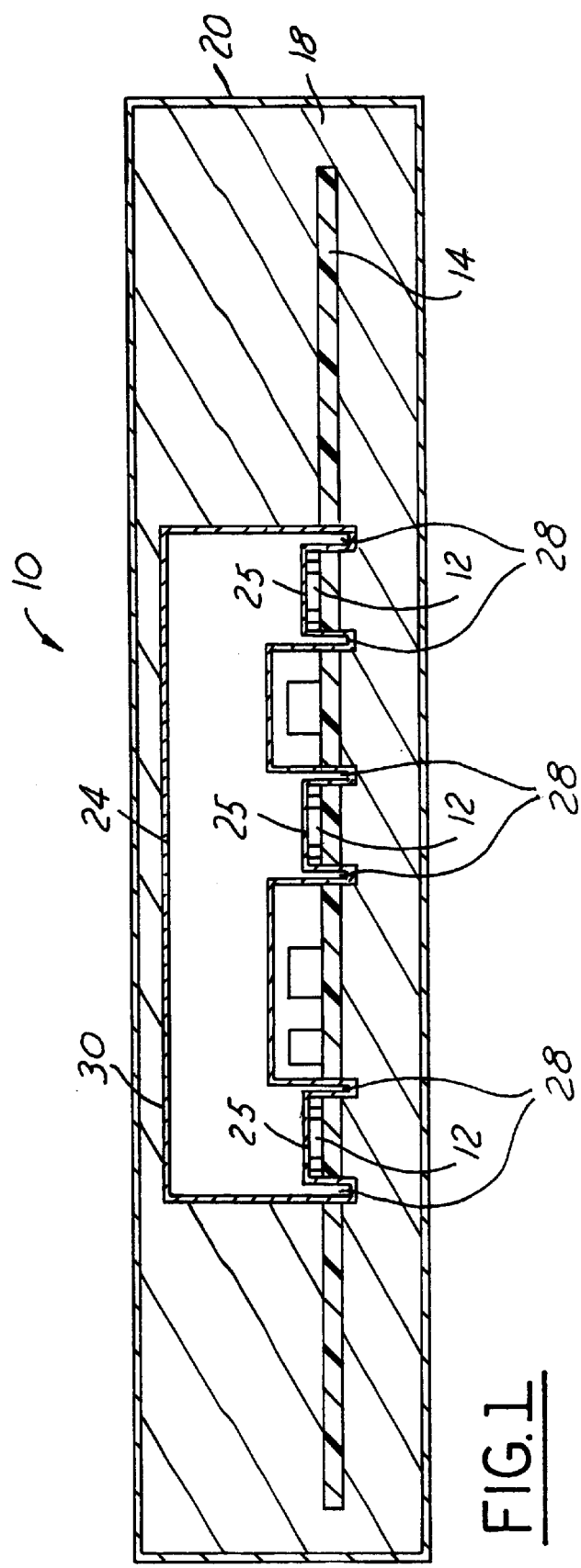
FIG. 1 is an illustration of an embodiment of a corrosive resistant electronics assembly in accordance with the present invention.

Referring now to FIG. 1 which is an illustration of a corrosive resistant electronics assembly 10 in accordance with the present invention. The corrosive resistant electronics assembly 10 is intended for use in corrosive environments and other environments where metal casing is undesirable. The corrosive resistant electronics assembly 10 includes at least one heat generating electronics component 12, such as a chip. Although the present invention is intended for use with a variety of heat generating electronics components, in one embodiment the corrosive resistant electronics assembly 10 is intended for use with flip chips. Flip chips are well known in the electronics industry.

The chip(s) 12, or heat generating electronics components, are mounted on a substrate 14. Although a variety of substrates are contemplated, several contemplated substrates include ceramic substrates, PCBs, and flex circuitboards. The corrosive resistant electronics assembly 10 can be designed to accomplish a variety of applications. Again, the use of flip chips 12 and substrates 14 to form an electronic assembly is well known in the prior art. When used in harsh or corrosive environments, however, it may become important to protect the electronic assembly 10 from exposure to Such environments. The use of a metal casing (not shown) is often not suitable as such a casing may react negatively with the corrosive environment. In such situations, it is known that a potting compound 18 and/or a plastic case 20 may be used to protect the electronic assembly 10 from the harsh environment. Although the use of potting agents 18 or plastic cases 20 are well known in the prior art, known designs are often disadvantaged by their inability to dissipate adequate heat from the flip chips 12 or other heat generating electronics components.

The present invention retains the corrosive resistance benefit of utilizing potted material 18 or plastic casing 20 while providing improved thermal dissipation characteristics and thereby provides a corrosive resistant electronics assembly 10 allowing for greater range of designs and applications. The present invention accomplishes these improvements by including a thermally conductive block element 24, such as a metal block, thermally mounted to the flip chip 12, or chip(s). The thermally conductive block element 24 is positioned within the potting material 18 or plastic cover 20 along with the flip chip 12 and substrate 14 and thereby is itself protected from the corrosive environment. The thermally conductive block element 24 can absorb heat from the flip chip(s) 12 and thereby acts as a heat sink for the corrosive resistant electronics assembly 10. In addition, however, since the thermally conductive block element 24 has a greater surface area than the flip chip(s) 12, it is also possible for the thermally conductive block element 24 to dissipate a portion of the heat into the potted material 18 and/or the plastic case 20. This provides further thermal dissipation and thereby allows a wider range of potential applications for the corrosive resistant electronics assembly 10. Although a variety of methods are contemplated for thermally mounting the thermally conductive block element 24 to tile flip chip(s) 12, one embodiment contemplates the use of low thermal resistance elastomeric adhesive joint 25, or other thermal conductive adhesive. It is contemplated that the thermally conductive block element 24, or metal block, can be composed of a variety of materials. In one embodiment the thermally conductive block element 24 is constructed using copper or copper alloys. In another embodiment, the metal block 24 is constructed using aluminum or aluminum alloys.

Although the primary function of the present invention is to provide thermal dissipation for flip chip(s) 12 in highly corrosive environments, the present invention provides additional beneficial characteristics. It is known that during the potting process, a substrate 14 can be bent by the potting material 18. Excessive substrate bending is known to cause potential fracture of the flip chip(s) 12 or their connections to the substrate 14. The thermally conductive block element 24 can provide additional stiffness to the substrate 14 in the area where the nip chip(s) 12 are mounted. This can reduce localized bending caused by the potting material 18 and thereby improves the reliability and structural integrity of the corrosive resistant electronics assembly 10. In an additional embodiment, the thermally conductive block element 24 call further include one or more pin elements 28 which rigidly mount the thermally conductive block element 24 to the substrate 14. This further stiffens the substrate 14 and reduces the potential for damage during the potting process. In still another embodiments the thermally conductive block element 24 may be coated or treated with an adhesion promoting layer 30, such as black copper oxide, to improve adhesion to the potting material 18 and the thermally conductive adhesive (25), if utilized, and thereby further enhance the localized stiffness in the substrate 14. Finally, in still another embodiment, the thermally conductive block element 24 may completely surround the flip chip or chip(s) 12 and thereby be used as a cover to prevent the potting material 18 from contacting the flip chip(s) 12. This is highly beneficial especially in situations where the potting material 18 has a high modulus and may potentially damage the flip chip(s) 12. If thermally conductive adhesive 25 is used, the adhesive 25 can be used to surround the nip chip 12 and to fill the gap between the flip chip 12 and the substrate 14 to further prevent potting material 18 from contacting the flip chip 12. It should be understood that in all embodiments, the thermally conductive block element 24 may be used either on a single flip chip 12 or for a plurality of flip clip(s) 12.

The present invention, in its many embodiments, provide a unique heat sink arrangement for use in severe environments. In addition, embodiments of the present invention may be further utilized to stiffen and reduce damage to the substrate 14, create a cover to prevent potting material 18 from contacting the flip chips 12, and can reduce and improve efficiency and performance by using a single thermally conductive block element 24 to create a heat sink from multiple flip chips 12.

While the invention is described in connection with one or more embodiments, it is to be understood that the specific mechanisms and techniques which have been described are merely illustrative of the principles of the invention, numerous modifications may be made to the methods and apparatus described without departing from the spirit and scope of the invention as defined by the appended claims.

What is claimed is:

1. A corrosive resistant electronics assembly comprising:
   a substrate;
   at least one heat generating electronics component mounted on said substrate;
   potting material surrounding said substrate and said at least one heat generating electronics component; and
   a thermally conductive block element positioned within said potting material and thermally mounted to said at least one heat generating electronics component; said thermally conductive block element surrounding said at least one heat generating electronics component to prevent said potting material from contacting said at least one heat generating electronics component.

2. A corrosive resistant electronics assembly as described in claim 1 further comprising:
   a thermally conductive adhesive mounting said thermally conductive block element to said at least one heat generating electronics component.

3. A corrosive resistant electronics assembly as described in claim 1 wherein said thermally conductive block element is comprised of copper based material.

4. A corrosive resistant electronics assembly as described in claim 1 wherein said thermally conductive block element is comprised of aluminum based material.

5. A corrosive resistant electronics assembly as described in claim 2 wherein said thermally conductive block element includes a coating to improve adhesion to the potting material and to said thermally conductive adhesive.

6. A corrosive resistant electronics assembly as described in claim 5 wherein said coating comprises copper oxide.

7. A corrosive resistant electronics assembly as described in claim 1 wherein said thermally conductive block element is mounted to said substrate to stiffen said substrate.

8. A corrosive resistant electronics assembly as described in claim 7 wherein said thermally conductive block element is mounted to said substrate through the use of a plurality of pin elements.

9. A corrosive resistant electronics assembly as described in claim 2 wherein said thermally conductive block element and said thermally conductive adhesive surrounds said at least one heat generating electronics component to prevent said potting material from contacting said at least one heat generating electronics component.

10. A corrosive resistant electronics assembly as described in claim 1 wherein said at least one heat generating electronics component comprises at least one chip.

11. A corrosive resistant electronics assembly as described in claim 1 wherein said at least one heat generating electronics component comprises at least one flip chip.

12. A corrosive resistant electronics assembly as described in claim 1 wherein said substrate comprises PCB.

13. A corrosive resistant electronics assembly as described in claim 1 wherein said substrate comprises a ceramic circuit board.

14. A corrosive resistant electronics assembly comprising:
    a plastic case;
    a substrate positioned within said plastic case;
    at least one heat generating electronics component mounted on said substrate; and
    a thermally conductive block element positioned within said plastic case and thermally mounted to said at least one heat generating electronics component; said thermally conductive block element mounted to said substrate to stiffen said substrate; said thermally conductive block element is mounted to said substrate through the use of a plurality of pin elements.

15. A corrosive resistant electronics assembly as described in claim 14 further comprising:
    a thermally conductive adhesive mounting said thermally conductive block element to said at least one heat generating electronics component.

16. A corrosive resistant electronics assembly as described in claim 14 wherein said thermally conductive block element is comprised of copper based material.

17. A corrosive resistant electronics assembly as described in claim 14 wherein said thermally conductive block element is comprised of aluminum based material.

18. A corrosive resistant electronics assembly as described in claim 14 wherein said thermally conductive block element surrounds said at least one heat generating electronics component.

19. A corrosive resistant electronics assembly as described in claim 15 wherein said thermally conductive block element and said thermally conductive adhesive surround said at least one heat generating electronics component.

20. A corrosive resistant electronics assembly as described in claim 14 wherein said at least one heat generating electronics component comprises at least one chip.

21. A corrosive resistant electronics assembly as described in claim 14 wherein said at least one heat generating electronics component comprises at least one flip chip.

22. A corrosive resistant electronics assembly as described in claim 14 wherein said substrate comprises PCB.

23. A corrosive resistant electronics assembly as described in claim 14 wherein said substrate comprises a ceramic circuit board.

24. A corrosive resistant electronics assembly as described in claim 15 wherein said thermally conductive block element includes a coating to improve adhesion to the potting material and to said thermally conductive adhesive.

25. A corrosive resistant electronics assembly as described in claim 24 wherein said coating comprises copper oxide.

26. A corrosive resistant electronics assembly comprising:
    a substrate;
    at least one heat generating electronics component mounted on said substrate;
    potting material surrounding said substrate and said at least one heat generating electronics component; and
    a thermally conductive block element positioned within said potting material and thermally mounted to said at least one heat generating electronics component;
    said thermally conductive block element mounted to said substrate through the use of a plurality of pin elements to stiffen said substrate.

* * * * *